United States Patent [19]

Zhu

[11] Patent Number: 4,951,107

[45] Date of Patent: Aug. 21, 1990

[54] KINETIC ENERGY MODULATED HOT ELECTRON TRANSISTOR

[76] Inventor: En-Jun Zhu, Institute for Microelectronics Peking University, Beijing, China

[21] Appl. No.: 87,069

[22] Filed: Aug. 18, 1987

[30] Foreign Application Priority Data

Aug. 21, 1986 [CN] China .................................. 86105050

[51] Int. Cl.$^5$ ............................................ H01L 29/72
[52] U.S. Cl. ......................................... 357/34; 357/16
[58] Field of Search ............................... 357/34, 16, 4

[56] References Cited

U.S. PATENT DOCUMENTS 4,712,121 12/1987 Yokoyama ............................. 357/4

FOREIGN PATENT DOCUMENTS 62-137867 6/1987 Japan .

OTHER PUBLICATIONS

Solid State Electronics, vol. 24, pp. 343, 361-364, by Heiblum, 1981.
Electronics Letters, vol. 21, #17, pp. 757-758, by Hase et al., Aug. 1985.
Yokoyama et al., "Characterization of Double Heterojunction GaAs/AlGaAs Hot Electron Transistors", Digest of 1984 IEDM, pp. 532-536 (1984).
Mead, "The Tunnel-Emmission Amplifier", *Proc. IRE*, vol. 48, pp. 359-361 (1960).
Malik et al., "Recitifying, Variable Planar-Doped-Barrier Structures in GaAs", Inst. Phys. Conf. Ser. No. 56, Chapter 9, pp. 697-710 (1981).
Shannon, "Hot-Electron Camel Transistor", *IEE J. Solid State & Electronic Devices*, vol. 3, pp. 142-144 (1979).
Heiblum, "Tunneling Hot Electron Transfer Amplifiers (THETA): Amplifiers Operating Up To The Infrared," *Solid-State Electronics*, 343-366 (pp. 343 and 361-364 provided), (1981) (vol. 24).

Primary Examiner—Andrew J. James
Assistant Examiner—Mark Prenty
Attorney, Agent, or Firm—Pennie & Edmonds

[57] ABSTRACT

A kinetic energy modulated hot electron transistor (KEMHET) wherein the input voltage does not change the amplitude of the input current, but modulates the kinetic energy of the input electron beam and the probability of electron transition beyond the output collector barrier, thus controlling the current transit coefficient α and the output current. The transistor comprises two heterojunctions, each consisting of a thin barrier layer and a thick electron drift region. The thick drift regions essentially eliminate variation in barrier shape with bias voltage and reduce junction capacitance. Such a structure can overcome the main problems of a conventional hot electron transistor, such as low current gain and large input capacitance. It has the advantages of high input impedance, high current gain, short transit time, high current density and transconductance, and no feed back capacitance between output and input. In other words, it has the advantages of both FET and bipolar transistor. Calculations demonstrate that its maximum oscillation frequency ($f_{max}$) can be as high as 1000 GHz.

7 Claims, 2 Drawing Sheets (a)

(b)

KINETIC ENERGY MODULATED HOT ELECTRON TRANSISTOR

TECHNICAL FIELD

The invention relates to hot electron transistors and more specifically to kinetic energy modulated hot electron transistors having two heterojunction structures.

BACKGROUND OF THE INVENTION

A hot electron transistor is a high-frequency, high-speed solid state device, first proposed by Mead in 1960. Efforts were made to develop such a device during the 1960's without success, due to difficulties encountered in its fabrication.

There has recently been an increasing amount of interest in this field because of the development of some new technologies, such as the molecular beam epitaxy. In 1980, Heiblum made a detailed survey of the work carried out in this area and proposed the "heterojunction structure". Using such a structure, preliminary experimental results have been reported by Yokoyama, Hase, and others.

A conventional "heterojunction structure" hot electron transistor is similar in several ways to a bipolar transistor. FIG. 1(a) illustrates the sectional structure, and FIG. 1b) an energy band diagram for such a bipolar transistor. Two electrodes (1) are located on the mesa for connecting to the emitter and the base. The emitter, base and collector layers are formed of GaAs, and 2Ga$_{0.65}$Al$_{0.35}$. Barrier layers (2) and (4) are located between these layers.

The transistor comprises two heterojunctions, each consisting of a thin barrier layer and a thick electron drift region. The thick drift regions essentially eliminate variation in barrier shape with bias voltage and reduce junction capacitance.

There are two main problems which occur with the use of this prior art structure:

1. The current transit coefficient, ($\alpha$) is small. ($\alpha$) is the ratio of the output current to the input current. Owing to the "scattering" in the base and the "quantum mechanics reflection" at the barrier interface, a portion of the injected electrons fall down to the base, so that the value of ($\alpha$) is much less than 1, and the gain of the device is low.

2. The emitter-base capacitance is rather large because of very thin barrier layer thickness, so that high frequency performance is limited.

SUMMARY OF THE INVENTION

A new structure for a hot electron transistor, i.e., a kinetic energy modulated hot electron transistor (KEMHET) is proposed. In this device, the input voltage does not change the amplitude of the input current, but rather, it modulates the kinetic energy of the input electron beam and the probability of electron transition beyond the output collector barrier, thus controlling the current transit coefficient ($\alpha$) and the output current.

Such a conventional device is composed of two heterojunctions, i.e., an emitter-base junction and base-collector junction, each of which includes a barrier layer. When a bias voltage is applied, a triangle-shaped potential barrier (3) will be formed. If the emitter-base bias voltage is higher, the effective thickness of the barrier wall near the emitter will be reduced. Electrons in the emitter can pass through the barrier by a tunneling effect, and will then transit across the base and the collector barrier, before they finally reach the collector. The amplitude of the input and output current is controlled by the input voltage.

Such a structure can overcome the major problems occuring with the use of a conventional hot electron transistor as discussed above.

DESCRIPTION OF THE INVENTION Detailed

Figure 1:
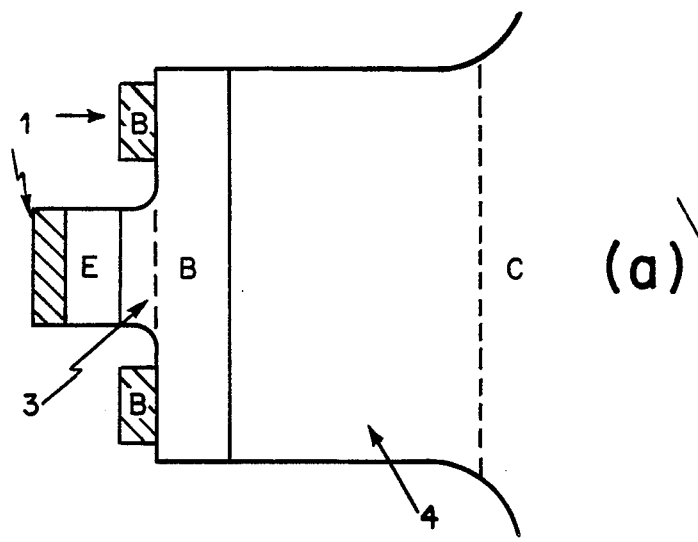
FIG. 1 illustrates: (a) the sectional structure and, (b) an energy band diagram of a conventional heterojunction hot electron transistor.
Figure 1:
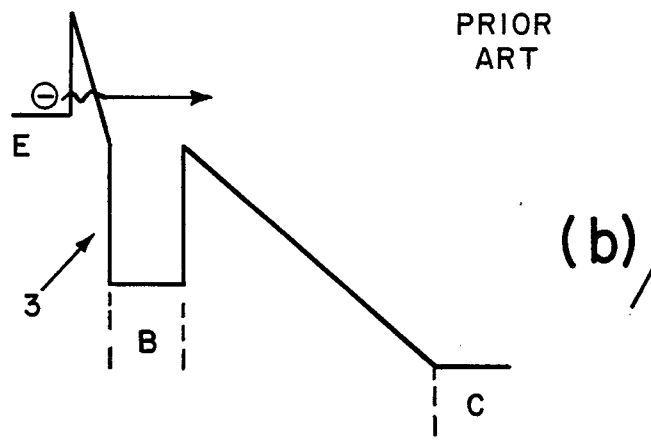
Figure 2:
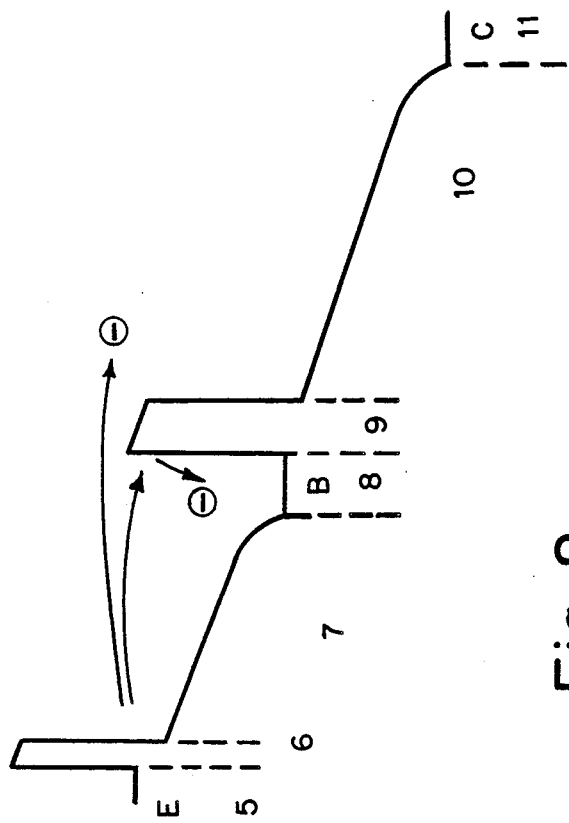
FIG. 2 is an energy band diagram for the proposed kinetic energy modulated hot electron transistor.

FIG. 2 illustrates an energy band diagram for the kinetic energy modulated hot electron transistor of the present invention. The materials, dopings, and thicknesses of each layer in the figure are listed, as follows (for example):

| No. | Layer | Material | Doping | Thickness |
|---|---|---|---|---|
| 5 | emitter | GaAs | $N^+ 3 \times 10^{18} cm^{-3}$ | 1000 Å |
| 6 | emitter barrier | Ga$_{0.65}$Al$_{0.35}$As | $N^-$ | 40 Å |
| 7 | emitter drift region | GaAs | $N\ 2 \times 10^{15} cm^{-3}$ | 1000 Å |
| 8 | base | GaAs | $N\ 2 \times 10^{17} cm^{-3}$ | 500 Å |
| 9 | collector barrier | Ga$_{0.65}$Al$_{0.35}$As | $N^-$ | 200 Å |
| 10 | collector drift region | GaAs | $N\ 2 \times 10^{15} cm^{-3}$ | 2000 Å |
| 11 | collector | GaAs | $N^+ 3 \times 10^{18} cm^{-3}$ | — |

The device is composed of two counter-biased heterojunctions connected in series. Each heterojunction includes a thin barrier region and a thick drift region, which acts to eliminate the variation of the barrier shape caused by the bias voltage, and functions to reduce the junction capacitance.

The emitter barrier (6) is thin, measuring about 50Å in thickness. Electrons can inject from emitter (5) through this barrier by a tunneling effect. When the emitter-bias voltage is added, the voltage will drop down, mainly in the thick drift region (7). The variation in the barrier shape with bias voltage is rather small so that the emitter current will remain nearly constant, independent of the change of bias.

Electrons injected from the emitter are accelerated within the drift region (7), moving through the base (8) and arriving at the collector barrier (9). If their kinetic energy is high enough, they will transit beyond the barrier (9), cross the collector drift region (10) and reach the collector (11). If the kinetic energy is not high enough, these electrons will be retarded by the collector barrier and fall down to the base.

The emitter-base input bias voltage does not affect the amplitude of the emitter current, but it does control the kinetic energy of the injected electrons and the probability of electron transition beyond the collector barrier. In other words, the input voltage controls the current transit coefficient ($\alpha$) and the output current and an effective transistor is provided.

The advantages of the inventor's proposed structure

1. High input impedance: the A.C. input resistance is very high because the emitter current does not change with the bias voltage. The input capacitance is also small, owing to the existence of the thick drift region (7).

2. High current gain, the current transit coefficient $\alpha$ itself is a variable; it varies from 0 to $\alpha_{max}$ (approx. 0.7). In this case, $\alpha_{max} < 1$ is not a serious problem; as the Ac input impedance is very small, the current gain $\beta \gg 1$.

3. Very short transit time: the alternating current signal will appear only after electrons transit beyond the collector barrier, so that only the collector transit time should be taken into account which is very short ($\ll 1ps$).

4. High current density and high transconductance: the hot electron transistor of the invention has a performance similar to the bipolar transistor. In addition, the electron ballistic velocity is very fast, so that its current density and transconductance can be very high, and the area of the device can be very small.

5. No feedback capacitance between input and output (with the base connected to a ground), which is better than the conventional FET and bipolar transistor.

In conclusion, this new structure has the main advantages of both FET (high input impedance) and bipolar transistor (high current density and high transconductance).

Calculations indicate that the maximum oscilation frequency $f_{max}$ can be given by:

$$f_{max} = \frac{1}{2\pi} \left( \frac{g_m}{r_b c_0 c_i} \right)^{\frac{1}{2}}$$

where $g_m$ is the transconductance, $r_b$ is the base resistance; and $c_0$ and $c_i$ are the output and input capacitances, respectively. The transconductance $g_m$ can be given by:

$$g_m = \frac{q I_c}{\Delta E}$$

where $I_c$ is the operating current and $\Delta E$ is the spread of electron kinetic energy, which is usually less than 0.1 ev.

For a suitable choice of the device dimensions, the estimated value of $f_{max}$ is 1000 GHz, which is a decade higher than the value obtained with conventional devices. The basic principle and the key performance mentioned above (high input impedance) have been verified by experiments. The remaining steps required to fabricate the device are similar to those for a conventional HET; no more special difficulty will be encountered in the realization of the KEMHET.

The principle and structure of this invention can also be used for other, related types of electrical devices, and the choice of suitable materials can be extended to other semiconductor compounds.

What is claimed is:

1. A hot electron transistor comprising an emitter, a base and a collector, said base being separated from said emitter and from said collector by input and output heterojunctions respectively, said input heterojunction comprising a relatively thin barrier layer, through which electrons may be injected from said emitter by a tunnelling effect, and a relatively thick electron drift region disposed between said barrier layer and said base.

2. The hot electron transistor of claim 1, wherein said output heterojunction also comprises a relatively thin barrier layer and a relatively thick electron drift region, disposed between said barrier layer and said collector.

3. The hot electron transistor of claim 2 wherein said thin barrier layers each comprise a $Ga_{0.65}Al_{0.35}As$ layer at least approximately 40 Å thick.

4. The hot electron transistor of claim 2 wherein said drift regions each comprise a layer of GaAs doped at $n = 2 \times 10^{15}$ cm$^{-3}$ at least about 1,000 Å thick.

5. The hot electron transistor of claim 2 wherein the material of said transistor other than that of the barrier layers has high electron mobility, long electron mean free path, high electron ballistic velocity, wide electron band gap and low electron affinity.

6. The hot electron transistor of claim 5 wherein said material is GaAs.

7. The hot electron transistor of claim 2, wherein said relatively thick electron drift regions are at least about ten times as thick as the corresponding relatively thin barrier layers.

* * * * *